United States Patent [19]

Nowak

[11] Patent Number: 5,099,211
[45] Date of Patent: Mar. 24, 1992

[54] BATTERY VOLTAGE MEASUREMENT SYSTEM

[76] Inventor: Dieter K. Nowak, Route 2, Box 2916, Winchester, Tenn. 37398

[21] Appl. No.: 498,702

[22] Filed: Mar. 26, 1990

[51] Int. Cl.⁵ ........................................ G01N 27/416
[52] U.S. Cl. ..................................... 324/434; 340/636
[58] Field of Search ............... 324/434, 426; 340/636; 320/48

[56] References Cited

U.S. PATENT DOCUMENTS

| | | | |
|---|---|---|---|
| 3,487,295 | 12/1969 | Nocera et al. | 324/434 |
| 3,515,983 | 6/1970 | Lante | 324/434 |
| 4,198,597 | 8/1980 | Sawyer | 324/434 |
| 4,304,823 | 3/1980 | Lemelson | 429/19 |
| 4,352,067 | 9/1982 | Ottone | 324/434 |
| 4,433,294 | 2/1984 | Windebank | 324/426 |
| 4,820,966 | 4/1989 | Fridman | 320/32 |
| 4,931,738 | 6/1990 | MacIntyre et al. | 324/435 |

FOREIGN PATENT DOCUMENTS 2015171  9/1979  United Kingdom ............... 324/434

Primary Examiner—Kenneth A. Wieder
Assistant Examiner—Maura K. Regan
Attorney, Agent, or Firm—Phillips & Beumer

[57] ABSTRACT

A measurement system for measuring discrete voltages of serially connected battery modules making up a battery power supply wherein there would be connected to each junction between cells one terminal of a dual-level voltage responsive switch and wherein the other terminal of each switch is connected to a common terminal. The switches are identical, and each would close at a first voltage across it and open at a second, slight higher, voltage. A ramp voltage is generated and connected from the common terminal and the high voltage terminal of the supply. The ramp voltage and current through this circuit are concurrently measured and displayed wherein the difference in voltage between the appearance of two current pulses is illustrative of the battery voltage of the battery module connected between switches giving rise to the current pulses.

7 Claims, 1 Drawing Sheet

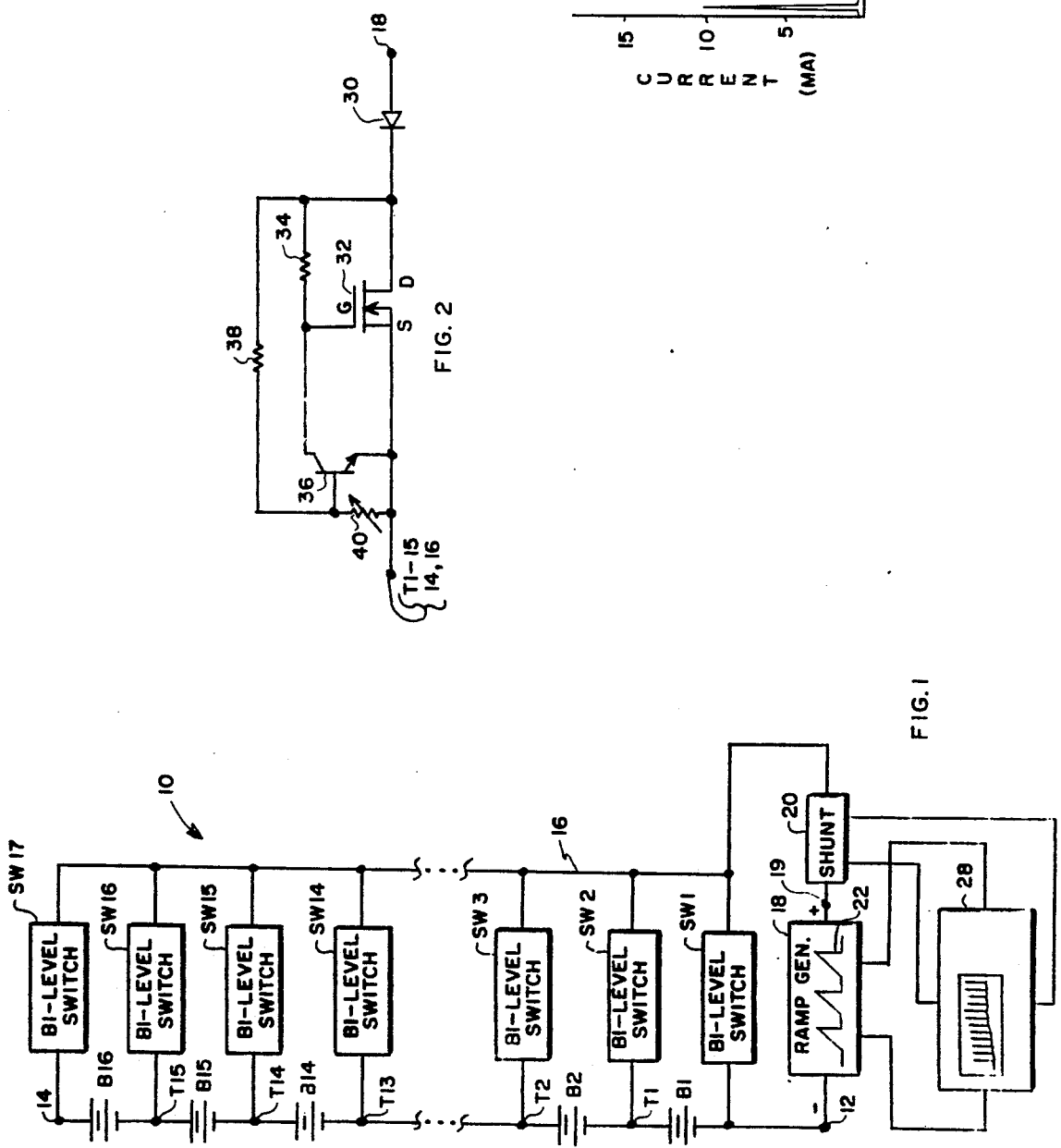

BATTERY VOLTAGE MEASUREMENT SYSTEM

FIELD OF THE INVENTION

This invention relates generally to measurements of battery power supplies and particularly to a system for measuring the voltage of individual battery modules making up a power supply.

BACKGROUND OF THE INVENTION

There are many instances in which battery cells, or battery modules, are serially connected in a bank or banks to provide a higher voltage than otherwise available. Unfortunately, the condition of the bank of cells as a whole is dependent upon the condition of individual cells or modules, and it is well known that in order to detect and locate a deteriorating one of these, individual measurements must be made at the cell or module level. As an example, where there is a bank voltage of 126 volts, it might be in the form of ten 12.6-volt lead acid batteries. In such case, condition measurements would typically require that each individual 12-volt battery be subject to measurement, which would necessitate the wiring harness extending from each battery back to the point of instrumentation making the measurement, and wherein there would be a wire for each terminal, or, in this case, a total of 11 wires. This has been regarded as quite cumbersome.

It is an object of this invention to eliminate all but two of the wires and at the same time eliminate the necessity for switching between battery modules in order to make individual measurements.

SUMMARY OF THE INVENTION

In accordance with this invention, one lead of a single voltage responsive switch is connected to each of the interconnecting battery terminals and a common terminal. In addition, such a switch is connected between this common terminal and one of the end terminals of the bank of batteries. The ramp voltage is then applied between the other end terminal and the common terminal, this ramp voltage being such as to extend from zero voltage to a voltage just in excess of the total voltage of the bank of batteries. As the voltage is ramped up, the switches are opened and closed, respectively, giving rise to current pulses. Both the ramp voltage and instantaneous current through this arrangement are coordinately provided as outputs, wherein the voltage between discrete pairs of pulses are an indication of the battery voltage, the switches giving rise to these pulses.

BRIEF DESCRIPTION OF THE DRAWINGS

FIG. 1 is a block diagram of an embodiment of the invention.

FIG. 2 is a schematic diagram of one of the switches employed in the system.

FIG. 3 is an oscillographic display of current versus voltage, particularly illustrating the operation of the system.

DESCRIPTION OF THE PREFERRED EMBODIMENT

Referring to FIG. 1, there is shown a battery assembly 10 consisting of a plurality of battery modules designated B1-B16, only seven of which are shown. The negative terminal of battery module B1 is connected to terminal 12, and the positive terminal of battery module B16 is connected to terminal 14, the intermediate batteries being connected by connecting terminals designated T1-T15, only T1-T2 and T13-T15 being shown. Two-threshold, or bi-level, switches S1-S17 are employed wherein one terminal of each is connected to common terminal 16, and the opposite lead of each is connected to one of terminals 12, T1-T15, or 14. Ramp generator 18 and current sensing shunt 20 are connected in series between negative terminal 12 and common terminal 16.

For each scan, ramp voltage generator 18 generates a ramp voltage waveform 22 which commences at zero and rises to approximately 4 volts above the nominal voltage of 96 volts of battery assembly 10. As the ramp voltage rises on terminal 16, it sequentially rises above the voltage appearing at each terminal T1-T15 and finally just above that on terminal 14. The ramp voltage is also applied as an X axis or horizontal sweep voltage to oscilloscope 28, and the voltage output of current measuring shunt 20 is connected to the Y or vertical axis input of oscilloscope 28.

A bi-level response switch, one of switches SW1-SW17, is connected between common lead 16 and each of terminals 12, 14, and T1-T15. These switches are identically set to close at a like discrete voltage at their terminals and to open at a slightly higher potential.

FIG. 2 shows a schematic circuit diagram of one of the switches which is generally labelled a bi-level switch (FIG. 1). Switch SW is voltage responsive across its terminals to close and pass current when its right terminal is more positive than its left by about 2 volts and to open and block current flow when this voltage difference rises to approximately 2.5 volts. These differences are reflected by the voltage current waveforms appearing on oscilloscope 28 and shown in calibrated form in FIG. 3 wherein, for example, the difference between the leading edge and trailing edge of pulse P1 marks this difference.

The operative current path of switch SW is through diode 30 and N-channel field effect transistor (FET) 32, the anode of diode 30 being connected to terminal 18, its cathode to the drain lead D of FET 32, and the source lead S of FET 32 being connected to the left-hand terminal of switch SW. FET 32 is controlled by the voltage divider consisting of resistor 34, for example, 1 megohm, and the collector-emitter circuit of transistor 36, these being connected through diode 30 across the switch. The control voltage for FET 32 appears across the collector-emitter circuit of transistor 36, it being connected between the gate lead G and source lead S of FET 32. Transistor 36 is in turn controlled by a voltage divider consisting of fixed resistor 38 and variable resistor 40, the former being on the order of 10 megohms, and the latter extending to 3 megohms. The voltage divider is connected across switch SW through diode 30, with variable resistor 40 being connected between the base and emitter of transistor 36.

Initially, the operation of switch SW1 (FIG. 1) will be considered, with ramp generator 18 just starting its rise from zero voltage. When the ramp voltage rises just above approximately 0.6 volt, a tiny current commences flowing through diode 30, resistor 38, and resistor 40 of switch SW1. This small current is not discernable in FIG. 3. There will be no current flow through switches SW2-SW17 as diode 30 of these switches will be blocked by virtue of the battery voltages on terminals T1-T15 and terminal 14 being higher than the voltage on common terminal or lead 16.

As the voltage on terminal 16 increases with respect to voltage on terminals 12, the largest percentage of this voltage will appear across the high impedance of the collector-emitter circuit of transistor 36, which at this point is turned off; and when this voltage rises to approximately 1.96 volts, its application between the gate and source leads of FET 32 causes the drain source circuit of FET 32 to conduct, effectively closing the circuit across the switch. There then follows a rising current as indicated by the leading edge of pulse P1 shown in FIG. 3.

Next, when the ramp voltage rises to approximately 2.48 volts, the voltage across variable resistor 40 rises to about 0.45 volt; and the latter voltage, being connected across the base-emitter circuit of transistor 36, causes it to conduct, lowering the impedance of its collector-emitter circuit and thereby the voltage across the gate-source terminals of FET 32, causing the impedance between the source and drain leads of the FET to change to essentially an open circuit. As a result, the current flow through the switch drops to essentially zero, this being shown by the trailing edge of pulse P1 occurring at approximately 2.5 volts, as shown.

Next, as the voltage of ramp generator 18 rises and reaches a point at its right terminal 19 which exceeds the voltage on terminal T1 (FIG. 1), taking into account the voltage of battery module B1, there occurs current conduction through the switch, this being illustrated by pulse P2 of FIG. 3. Thereafter, as the ramp voltage continues to rise, the switching action just described will repeat in the balance of the switches, that is, switches SW3-SW17 giving rise to the succeeding current pulses shown in FIG. 3. Significantly, if one reads the voltage from FIG. 3 from succeeding on otherwise identical points on the current pulse waveforms, the voltage difference will be indicative of the voltage of the particular battery module between which succeeding switches have been operated to create the current pulses.

It is to be noted that the base point for the current pulses gradually rises on the display of FIG. 3, this occurring by virtue of there being increased current flow with increasing ramp voltage as more of diodes 30 of the switches conduct through resistors B8 and 40. Where module voltages are simply determined by visual examination of the display, such as shown in FIG. 3, this poses no point of error. Whereas, where battery module voltage is determined from an amplitude points on the trailing or leading edges of the pulses, appropriate compensation would be provided to comparators making such an examination either by hardware or via software.

From the foregoing, it is to be appreciated that applicant's system provides a simple, in both hardware and operation, means of battery module analysis. No switching systems are needed, and wire connections from the environs of the batteries to any remotely located measurement system need only total two wires.

Having thus described my invention, what is claimed is:

1. In combination:
   a pair of first and second terminals;
   a battery assembly connected between said terminals comprising a plurality of serially arranged battery modules, each module having a pair of plus and minus battery terminals;
   a plurality of intermediate terminals, each interconnecting a plus terminal of one said battery module to the negative terminal of an adjacent said battery module;
   a common electrical lead;
   ramp voltage generating means for generating a D.C. ramp voltage extending from approximately zero to a voltage slightly exceeding a voltage of said serially arranged plurality of battery modules, said ramp voltage being connected between said first terminal and said common electrical lead and wherein said battery voltages at said second terminal with respect to said first terminal and said ramp voltage at said common lead with respect to said first terminal are of like polarity;
   a plurality of voltage responsive switching means, each connected between said common electrical lead and a discrete battery terminal for effecting a closed circuit responsive to a first level ramp voltage and an open circuit responsive to a ramp voltage of increased level, whereby said switching means are discretely and separately closed and opened as a function of ramp voltage;
   current sensing means in circuit with said common lead and ramp generating means for providing an output responsive to current flow during discrete closed circuit conditions of each said switching means; and
   indicating means responsive to said ramp voltage and said current sensing means for indicating current flow versus ramp voltage, whereby a discrete difference in ramp voltage between indications of current flow is indicative of the discrete voltage of a discrete said battery module.

2. A combination as set forth in claim 1 wherein said indicating means comprises display means for displaying an X-Y coordinate presentation, wherein voltage is one of said coordinates and current is the other.

3. A combination as set forth in claim 2 wherein said indicating means comprises an oscilloscope.

4. A combination as set forth in claim 1 wherein said switching means comprises:
   a first electronic switch having a control input and a circuit coupled between said common electrical lead and a said terminal; and
   a second electrical switch having a control input responsive to the voltage between said common electrical lead and a said last-named terminal for providing a first, closing, input to said control input of said electronic switch responsive to a first potential between said common electrical lead and an open input to said first electrical switch responsive to a higher said potential.

5. A combination as set forth in claim 4 wherein said electronic switch is a field effect transistor and diode, the drain and source leads of which are connected in series with said diode between said common lead and one of said terminals.

6. A combination as set forth in claim 5 wherein said second electronic switch comprises:
   a transistor;
   a transistor input circuit consisting of a voltage divider comprising first and second impedance elements connected across said first electronic switch and wherein said first impedance is connected across the input of said last-named transistor; and
   a transistor output circuit comprising a voltage divider consisting of the collector-emitter output of said last-named transistor and a resistor, said output circuit being connected across the output of said first electronic switch as said input of said field effect transistor being connected across the output of said transistor of said first electronic switch.

7. A combination as set forth in claim 6 wherein said impedances of said first electronic switch are resistors and said first impedance is a variable resistor.

* * * * *